US008816332B2

(12) United States Patent
Forrest et al.

(10) Patent No.: US 8,816,332 B2
(45) Date of Patent: Aug. 26, 2014

(54) ORGANIC PHOTOVOLTAIC CELL INCORPORATING ELECTRON CONDUCTING EXCITON BLOCKING LAYERS

(75) Inventors: Stephen R. Forrest, Ann Arbor, MI (US); Brian E. Lassiter, Ypsilanti, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 13/400,963

(22) Filed: Feb. 21, 2012

(65) Prior Publication Data
US 2012/0235125 A1  Sep. 20, 2012

Related U.S. Application Data

(60) Provisional application No. 61/444,899, filed on Feb. 21, 2011, provisional application No. 61/479,237, filed on Apr. 26, 2011.

(51) Int. Cl.
H01L 29/08 (2006.01)
H01L 35/24 (2006.01)
H01L 51/00 (2006.01)

(52) U.S. Cl.
USPC ............... 257/40; 257/E51.012; 257/E51.026

(58) Field of Classification Search
USPC ............................ 257/40, E51.012, E51.026
See application file for complete search history.

(56) References Cited

U.S. PATENT DOCUMENTS 6,352,777 B1 * 3/2002 Bulovic et al. ............. 428/411.1
6,884,093 B2 * 4/2005 Baldo et al. ..................... 439/99
7,154,114 B2 * 12/2006 Brooks et al. .................... 257/40
7,211,823 B2 * 5/2007 Tung et al ........................ 257/40
7,597,927 B2 * 10/2009 Peumans et al. ............... 427/74
7,914,909 B2 * 3/2011 Watanabe et al. ............. 428/690
8,147,989 B2 * 4/2012 Kondakova et al. .......... 428/690
8,294,161 B2 * 10/2012 Hunze et al. .................... 257/79
8,384,070 B2 * 2/2013 Kishino ........................... 257/40
8,476,823 B2 * 7/2013 Kuma et al. .................. 313/504
8,524,517 B2 * 9/2013 Ahn ................................ 438/46
8,686,139 B2 * 4/2014 Lux et al. ....................... 544/251
2004/0067324 A1 * 4/2004 Lazarev et al. .............. 428/1.31
2004/0113546 A1 * 6/2004 Forrest et al. ................. 313/504

(Continued)

FOREIGN PATENT DOCUMENTS

WO   WO 2010-120393 A2   10/2010

OTHER PUBLICATIONS

International Search Report from PCT/US2012/025916 filede Feb. 21, 2012.

*Primary Examiner* — Ida M Soward
(74) *Attorney, Agent, or Firm* — Finnegan, Henderson, Farabow, Garrett & Dunner LLP

(57) ABSTRACT

The present disclosure relates to photosensitive optoelectronic devices including a compound blocking layer located between an acceptor material and a cathode, the compound blocking layer including: at least one electron conducting material, and at least one wide-gap electron conducting exciton blocking layer. For example, 3,4,9,10 perylenetetracarboxylic bisbenzimidazole (PTCBI) and 1,4,5,8-napthalene-tetracarboxylic-dianhydride (NTCDA) function as electron conducting and exciton blocking layers when interposed between the acceptor layer and cathode. Both materials serve as efficient electron conductors, leading to a fill factor as high as 0.70. By using an NTCDA/PTCBI compound blocking layer structure increased power conversion efficiency is achieved, compared to an analogous device using a conventional blocking layers shown to conduct electrons via damage-induced midgap states.

33 Claims, 5 Drawing Sheets

(56) References Cited

U.S. PATENT DOCUMENTS

| | | |
|---|---|---|
| 2004/0209116 A1* | 10/2004 | Ren et al. ............... 428/690 |
| 2005/0211974 A1* | 9/2005 | Thompson et al. ......... 257/40 |
| 2006/0027834 A1 | 2/2006 | Forrest |
| 2008/0258615 A1* | 10/2008 | Begley et al. ............ 313/504 |
| 2008/0260970 A1* | 10/2008 | Nakayama et al. ......... 428/1.1 |
| 2009/0217980 A1* | 9/2009 | Pfeiffer et al. ........... 136/263 |
| 2009/0229668 A1 | 9/2009 | Kim |
| 2009/0267060 A1* | 10/2009 | Forrest et al. ............. 257/40 |
| 2010/0025663 A1* | 2/2010 | Sun et al. ................. 257/40 |
| 2010/0041177 A1* | 2/2010 | Yang et al. ............... 438/82 |
| 2010/0065829 A1* | 3/2010 | Forrest et al. ............. 257/40 |
| 2010/0089443 A1* | 4/2010 | Bloomstein et al. ........ 136/255 |
| 2011/0127510 A1* | 6/2011 | Seo et al. ................. 257/40 |
| 2011/0204416 A1* | 8/2011 | Forrest et al. ............. 257/184 |
| 2011/0215309 A1* | 9/2011 | D'Andrade et al. ......... 257/40 |
| 2011/0308592 A1* | 12/2011 | Konemann et al. ......... 136/255 |
| 2012/0126205 A1* | 5/2012 | Kawamura et al. ......... 257/40 |
| 2012/0216870 A1* | 8/2012 | So et al. .................. 136/263 |
| 2012/0238105 A1* | 9/2012 | Anemian et al. ........... 438/758 |
| 2012/0241723 A1* | 9/2012 | Klem et al. ............... 257/21 |
| 2013/0240868 A1* | 9/2013 | Dobbs et al. .............. 257/40 |

* cited by examiner

ORGANIC PHOTOVOLTAIC CELL INCORPORATING ELECTRON CONDUCTING EXCITON BLOCKING LAYERS

CROSS-REFERENCE TO RELATED APPLICATION

This application claims the benefit of priority to U.S. Provisional Application No. 61/444,899, filed on Feb. 21, 2011, and U.S. Provisional Application No. 61/479,237, filed on Apr. 26, 2011, both of which are incorporated herein by reference in their entireties.

STATEMENT REGARDING FEDERALLY SPONSORED RESEARCH

This invention was made with U.S. Government support under DE-SC00000957 and DE-SC0001013, both awarded by the U.S. Department of Energy. The government has certain rights in the invention.

JOINT RESEARCH AGREEMENT

The claimed invention was made by, on behalf of, and/or in connection with one or more of the following parties to a joint university-corporation research agreement: University of Michigan, and Global Photonic Energy Corporation. The agreement was in effect on and before the date the invention was made, and the claimed invention was made as a result of activities undertaken within the scope of the agreement.

FIELD OF THE DISCLOSURE

The present disclosure generally relates to photosensitive optoelectronic devices comprising at least one blocking layer, such as electron conducting, exciton blocking layers. The present disclosure also relates to methods of increasing power conversion efficiency in photosensitive optoelectronic devices using at least one the blocking layers described herein. The electron conducting, exciton blocking layers of the devices presently disclosed may provide for improved performance characteristics, such as increased open circuit voltage, short circuit current, fill factor, or power conversion efficiency.

BACKGROUND

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. As a general rule, a photovoltaic cell provides power to a circuit, device or equipment, but does not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%. More recent efforts have focused on the use of organic photovoltaic cells to achieve acceptable photovoltaic conversion efficiencies with economical production costs.

PV devices may be optimized for maximum electrical power generation under standard illumination conditions (i.e., Standard Test Conditions which are 1000 W/m$^2$, AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, in Amperes (2) the photovoltage under open circuit conditions, i.e., the open circuit voltage $V_{OC}$, in Volts and (3) the fill factor, FF.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have the values, $I_{max}$ and $V_{max}$, respectively.

A figure of merit for PV devices is the fill factor, FF, defined as:

$$FF = \{I_{max}V_{max}\}/\{I_{SC}V_{OC}\} \quad (1)$$

where FF is always less than 1, as $I_{SC}$ and $V_{OC}$ are never obtained simultaneously in actual use. Nonetheless, as FF approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_p$, may be calculated by:

$$\eta_P = FF*(I_{SC}*V_{OC})/P_{inc}$$

When electromagnetic radiation of an appropriate energy is incident upon a semiconductive organic material, for example, an organic molecular crystal (OMC) material, or a polymer, a photon can be absorbed to produce an excited molecular state. This is represented symbolically as $S_0 + h\nu \Psi S_0^*$. Here $S_0$ and $S_0^*$ denote ground and excited molecular states, respectively. This energy absorption is associated with the promotion of an electron from a bound state in the highest occupied molecular orbital (HOMO) energy level, which may be a B-bond, to the lowest unoccupied molecular orbital (LUMO) energy level, which may be a B*-bond, or equivalently, the promotion of a hole from the LUMO energy level to the HOMO energy level. In organic thin-film photoconductors, the generated molecular state is generally believed to be an exciton, i.e., an electron-hole pair in a bound state which is transported as a quasi-particle. The excitons can have an appreciable life-time before geminate recombination, which refers to the process of the original electron and hole recombining with each other, as opposed to recombination with holes or electrons from other pairs. To produce a photocurrent the electron-hole pair becomes separated, typically at a donor-acceptor interface between two dissimilar contacting organic thin films. If the charges do not separate, they can recombine in a geminant recombination process, also known as quenching, either radiatively, by the emission of light of a lower energy than the incident light, or non-radiatively, by the production of heat. Either of these outcomes is undesirable in a photosensitive optoelectronic device.

Electric fields or inhomogeneities at a contact may cause an exciton to quench rather than dissociate at the donor-acceptor interface, resulting in no net contribution to the current. Therefore, it is desirable to keep photogenerated excitons away from the contacts. This has the effect of limiting the diffusion of excitons to the region near the junction so that the associated electric field has an increased opportunity to separate charge carriers liberated by the dissociation of the excitons near the junction.

To produce internally generated electric fields which occupy a substantial volume, the usual method is to juxtapose two layers of material with appropriately selected conductive properties, especially with respect to their distribution of molecular quantum energy states. The interface of these two materials is called a photovoltaic heterojunction. In traditional semiconductor theory, materials for forming PV heterojunctions have been denoted as generally being of either n or p type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the highest occupied molecular orbital (HOMO) energy level and the lowest unoccupied molecular orbital (LUMO) energy level, called the HOMO-LUMO gap. The Fermi energy characterizes the statistical occupation of molecular quantum energy states denoted by the value of energy for which the probability of occupation is equal to ½. A Fermi energy near the LUMO energy level indicates that electrons are the predominant carrier. A Fermi energy near the HOMO energy level indicates that holes are the predominant carrier. Accordingly, the Fermi energy is a primary characterizing property of traditional semiconductors and the prototypical PV heterojunction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the heterojunction between appropriately selected materials.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

In the context of organic materials, the terms "donor" and "acceptor" refer to the relative positions of the HOMO and LUMO energy levels of two contacting but different organic materials. This is in contrast to the use of these terms in the inorganic context, where "donor" and "acceptor" may refer to types of dopants that may be used to create inorganic n- and p-types layers, respectively. In the organic context, if the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

A significant property in organic semiconductors is carrier mobility. Mobility measures the ease with which a charge carrier can move through a conducting material in response to an electric field. In the context of organic photosensitive devices, a layer including a material that conducts preferentially by electrons due to a high electron mobility may be referred to as an electron transport layer, or ETL. A layer including a material that conducts preferentially by holes due to a high hole mobility may be referred to as a hole transport layer, or HTL. Preferably, but not necessarily, an acceptor material is an ETL and a donor material is a HTL.

Conventional inorganic semiconductor PV cells employ a p-n junction to establish an internal field. Early organic thin film cell, such as reported by Tang, *Appl. Phys Lett.* 48, 183 (1986), contain a heterojunction analogous to that employed in a conventional inorganic PV cell. However, it is now recognized that in addition to the establishment of a p-n type junction, the energy level offset of the heterojunction also plays an important role.

The energy level offset at the organic D-A heterojunction is believed to be important to the operation of organic PV devices due to the fundamental nature of the photogeneration process in organic materials. Upon optical excitation of an organic material, localized Frenkel or charge-transfer excitons are generated. For electrical detection or current generation to occur, the bound excitons must be dissociated into their constituent electrons and holes. Such a process can be induced by the built-in electric field, but the efficiency at the electric fields typically found in organic devices (F~$10^6$ V/cm) is low. The most efficient exciton dissociation in organic materials occurs at a donor-acceptor (D-A) interface. At such an interface, the donor material with a low ionization potential forms a heterojunction with an acceptor material with a high electron affinity. Depending on the alignment of the energy levels of the donor and acceptor materials, the dissociation of the exciton can become energetically favorable at such an interface, leading to a free electron polaron in the acceptor material and a free hole polaron in the donor material.

Organic PV cells have many potential advantages when compared to traditional silicon-based devices. Organic PV cells are light weight, economical in materials use, and can be deposited on low cost substrates, such as flexible plastic foils. However, organic PV devices typically have relatively low external quantum efficiency (electromagnetic radiation to electricity conversion efficiency), being on the order of 1% or less. This is, in part, thought to be due to the second order nature of the intrinsic photoconductive process. That is, carrier generation requires exciton generation, diffusion and ionization or collection. There is an efficiency reassociated with each of these processes. Subscripts may be used as follows: P for power efficiency, EXT for external quantum efficiency, A for photon absorption, ED for diffusion, CC for collection, and INT for internal quantum efficiency. Using this notation:

$$\eta_P \sim \eta_{EXT} = \eta_A * \eta_{ED} * \eta_{CC}$$

$$\eta_{EXT} = \eta_A * \eta_{INT}$$

The diffusion length ($L_D$) of an exciton is typically much less ($L_D$~5 nm) than the optical absorption length (~50 nm), requiring a trade-off between using a thick layer where generated excitons are too distant to be dissociated at the heterojunction, or a thin cell with a low optical absorption efficiency.

The power conversion efficiency may be expressed as $$\eta_P = \frac{V_{OC} \cdot FF \cdot J_{SC}}{P_0},$$

where $V_{OC}$ is the open circuit voltage, FF is the fill factor, $J_{sc}$ is the short circuit current, and $P_0$ is the input optical power. One way to improve $\eta_P$ is through the enhancement of $V_{oc}$, which is still 3-4 times less than the typical absorbed photon energy in most organic PV cells. The relationship between dark current and $V_{oc}$ may be inferred from:

$$J = \frac{R_P}{R_S + R_P}\left\{J_S\left[\exp\left(\frac{q(V - JR_S)}{nkT}\right) - 1\right] + \frac{V}{R_P}\right\} - J_{ph}(V) \quad (1)$$

where J is the total current, $J_s$ is the reverse dark saturation current, n is the ideality factor, $R_s$ is the series resistance, $R_p$ is the parallel resistance, V is the bias voltage, and $J_{ph}$ is the photocurrent (Rand et al., *Phys. Rev. B*, vol. 75, 115327 (2007)). Setting J=0:

$$V_{OC} = \frac{nkT}{q}\ln\left(\frac{J_{ph}(V_{OC})}{J_S} + 1 - \frac{V_{OC}}{R_P J_z}\right) \quad (2)$$

when $J_{ph}/J_s \gg 1$, $V_{OC}$ is proportional to $\ln(J_{ph}/J_s)$, suggesting that a large dark current, $J_s$, results in a reduction in $V_{OC}$.

Exciton blocking layers that also function as electron blocking layers have been developed for polymer Bulk Heterojunction (BHJ) PV cells (Haim et al., *Appl. Phys. Lett.*, vol. 92, 023504 (2008)). In polymer BHJ PV cells, blended polymers of donor and acceptor materials are used as the active region. These blends can have regions of donor or acceptor material extending from one electrode to the other. Therefore, there can be electron or hole conduction pathways between the electrodes through one type of polymer molecule.

Besides polymer BHJ PV cells, other architectures, including planar PV devices, also exhibit a significant electron or hole leakage current across the donor/acceptor heterojunction when $\Delta E_L$ or $\Delta E_H$ is small, even though these films may not have single material (donor or acceptor) pathways between the two electrodes.

The present disclosure relates to photosensitive optoelectronic devices comprising a compound blocking layer located between an acceptor material and a cathode, the compound blocking layer comprising: at least one electron conducting material, and at least one wide-gap electron conducting exciton blocking layer. This combination of materials serve as efficient electron conductors, leading to an improved fill factor and increased power conversion efficiency, compared to an analogous device using a conventional blocking layers.

SUMMARY OF THE DISCLOSURE

There is disclosed an organic photosensitive optoelectronic device comprising: two electrodes comprising an anode and a cathode in superposed relation; at least one donor material and at least one acceptor material, wherein the donor material and the acceptor material form a photo-active region between the two electrodes; and a compound blocking layer located between the acceptor material and the cathode.

In one embodiment, the compound blocking layer comprises: at least one electron conducting material, and widegap electron conducting exciton blocking layer.

In another embodiment, the at least one acceptor material has a lowest unoccupied molecular orbital energy (LUMO-1) and the at least one electron conducting exciton blocking layer has a lowest unoccupied molecular orbital energy (LUMO-2), wherein LUMO-1 and LUMO-2 are aligned to permit electron transport directly from the acceptor material to the cathode. As used herein, LUMO levels aligned to permit transport directly from the acceptor material to the cathode means having an energy gap between the first lowest unoccupied molecular orbital energy and the second lowest unoccupied molecular orbital energy no greater than 0.5 eV, such as no greater than 0.3 eV, or even less than 0.2 eV.

In one embodiment, the at least one donor material is chosen from squarine (SQ), boron subphthalocyanonine chloride (SubPc), copper phthalocyanine (CuPc), chloro-aluminum phthalocyanine (ClAlPc), poly(3-hexylthiophene) (P3HT), tin phthalocyanine (SnPc), pentacene, tetracene, diindenoperylene (DIP), and combinations thereof The at least one acceptor material is chosen from $C_{60}$, $C_{70}$ fullerenes, 3,4,9,10-perylenetetracarboxylic dianhydride (PTCDA), perfluorinated copper phthalocyanine ($F_{16}$—CuPc), PCBM, $PC_{70}BM$, and combinations thereof.

In one embodiment, the at least one electron conducting material comprises 3,4,9,10 perylenetetracarboxylic bisbenzimidazole (PTCBI).

In another embodiment, the at least one wide-gap electron conducting exciton blocking layer comprises 1,4,5,8-napthalene-tetracarboxylic-dianhydride (NTCDA).

Another embodiment used the combination of one electron conducting material comprising 3,4,9,10 perylenetetracarboxylic bisbenzimidazole (PTCBI), and at least one wide-gap electron conducting exciton blocking layer comprising 1,4,5,8-napthalene-tetracarboxylic-dianhydride (NTCDA).

The various layers disclosed herein have thicknesses the compound blocking layer has a thickness ranging from 10-100 nm, with the at least one electron conducting material ranging from 2-10 nm and the at least one wide-gap electron conducting exciton blocking layer ranging from 5-100 nm.

It is appreciated that the organic photosensitive optoelectronic device is an organic photodetector, such as an organic solar cell. In one embodiment, the organic solar cell exhibits at least one of the following properties:
  a fill factor greater than 0.62,
  a spectrally corrected power conversion efficiency of at least 5.0% under 1 sun, AM1.5G illumination, or
  a short circuit current of at least 7.5 mA/cm².

In one embodiment, the least one electrode may comprise transparent conducting oxides, thin metal layers, or transparent conducting polymers. Non-limiting examples of the conducting oxides include indium tin oxide (ITO), tin oxide (TO), gallium indium tin oxide (GITO), zinc oxide (ZO), and zinc indium tin oxide (ZITO), thin metal layers are comprised of Ag, Al, Au or combinations thereof, and the transparent conductive polymers comprise polyanaline (PANI) and 3,4-polyethylenedioxythiophene:polystyrenesulfonate (PEDOT:PSS).

Non-limiting examples of the at least one electrode include a metal substitute, a non-metallic material or a metallic material chosen from Ag, Au, Ti, Sn, and Al.

In one embodiment, the at least one donor material comprises squarine, the at least one acceptor material comprises $C_{60}$, the at least one electron conducting material comprises 3,4,9,10 perylenetetracarboxylic bisbenzimidazole (PTCBI), and the at least one wide-gap electron conducting exciton blocking layer comprises 1,4,5,8-napthalene-tetracarboxylic-dianhydride (NTCDA).

There is also disclosed a method of making an organic photosensitive optoelectronic device, the method comprising depositing onto a substrate at least one electrode comprising an anode and a cathode in superposed relation; at least one donor material and at least one acceptor material, wherein the donor material and the acceptor material form a photo-active region between the two electrodes; and depositing a compound blocking layer between the acceptor material and the cathode, the compound blocking layer comprising: at least one electron conducting material, and at least one wide-gap electron conducting exciton blocking layer.

In another embodiment, the method comprises depositing the disclosed materials, such as the at least one acceptor material having a lowest unoccupied molecular orbital energy (LUMO-1) and the at least one electron conducting exciton blocking layer having a lowest unoccupied molecular orbital energy (LUMO-2), wherein LUMO-1 and LUMO-2 are aligned to permit electron transport directly from the acceptor material to the cathode.

In one embodiment, the at least one donor material used in the disclosed method is chosen from squarine (SQ), boron subphthalocyanonine chloride (SubPc), copper phthalocyanine (CuPc), chloro-aluminum phthalocyanine (ClAlPc), poly(3-hexylthiophene) (P3HT), tin phthalocyanine (SnPc), pentacene, tetracene, diindenoperylene (DIP), and combinations thereof.

The at least one acceptor material used in the disclosed method is chosen from $C_{60}$, $C_{70}$ fullerenes, 3,4,9,10-perylenetetracarboxylic dianhydride (PTCDA), perfluorinated copper phthalocyanine ($F_{16}$—CuPc), PCBM, $PC_{70}BM$, and combinations thereof.

In one embodiment, at least one electron conducting material used in the disclosed method comprises 3,4,9,10 perylenetetracarboxylic bisbenzimidazole (PTCBI).

In another embodiment, the at least one wide-gap electron conducting exciton blocking layer used in the disclosed method comprises 1,4,5,8-napthalene-tetracarboxylic-dianhydride (NTCDA).

Another embodiment of the disclosed method uses the combination of one electron conducting material, such as 3,4,9,10 perylenetetracarboxylic bisbenzimidazole (PTCBI), and at least one wide-gap electron conducting exciton blocking layer, such as 1,4,5,8-napthalene-tetracarboxylic-dianhydride (NTCDA).

The method disclosed herein comprises depositing layers having various thicknesses, such as a compound blocking layer having a thickness ranging from 10-100 nm, with the at least one electron conducting material ranging from 2-10 nm and the at least one wide-gap electron conducting exciton blocking layer ranging from 5-100 nm.

The disclosed method also comprises depositing at the least one electrode that may comprise transparent conducting oxides, thin metal layers, or transparent conducting polymers. Non-limiting examples of the conducting oxides include indium tin oxide (ITO), tin oxide (TO), gallium indium tin oxide (GITO), zinc oxide (ZO), and zinc indium tin oxide (ZITO), thin metal layers are comprised of Ag, Al, Au or combinations thereof, and the transparent conductive polymers comprise polyanaline (PANI) and 3,4-polyethylenedioxythiophene:polystyrenesulfonate (PEDOT:PSS).

Non-limiting examples of the at least one electrode include a metal substitute, a non-metallic material or a metallic material chosen from Ag, Au, Ti, Sn, and Al.

In one embodiment, the method comprises deposition at least one donor material comprising squarine, at least one acceptor material comprising $C_{60}$, at least one electron conducting material comprising 3,4,9,10 perylenetetracarboxylic bisbenzimidazole (PTCBI), and at least one wide-gap electron conducting exciton blocking layer comprising 1,4,5, 8-napthalene-tetracarboxylic-dianhydride (NTCDA).

The present disclosure is further directed to a method of increasing the power conversion efficiency of a photosensitive optoelectronic device comprising incorporating the compound blocking layer into the device.

Aside from the subject matter discussed above, the present disclosure includes a number of other exemplary features such as those explained hereinafter. It is to be understood that both the foregoing description and the following description are exemplary only.

BRIEF DESCRIPTION OF THE DRAWINGS

The accompanying figures are incorporated in, and constitute a part of, this specification.

DETAILED DESCRIPTION

Significant progress has been made over the last 25 years in improving the efficiency of organic photovoltaic (OPV) cells. An important milestone to increased efficiency was the introduction of a buffer layer interposed between the acceptor layer and cathode contact, forming a so-called "double heterojunction" solar cell. The ideal buffer serves multiple purposes: to protect the underlying acceptor material (e.g. $C_{60}$) from damage due to the evaporation of hot cathode metal atoms, to provide efficient electron transport to the cathode, to serve as an exciton blocking layer (EBL) that prevents excitons generated in the acceptor from quenching at the cathode, and to act as a spacer that maximizes the optical field at the active donor-acceptor heterojunction.

The most commonly used EBLs are wide energy gap (and hence transparent) semiconductors, such as bathocuproine (BCP), that transport carriers via cathode metal-deposition-induced damage that results in a high density of conducting trap states (FIG. 1a). However, as the layer is conductive only in the presence of traps, the thickness is limited by the depth of damage (<10 nm), which may not be optimal for achieving a maximum optical field intensity in the active region of the device.

One possible route to the use of thicker, wide energy gap EBLs is to dope the film to increase its conductivity. A second type of EBL was introduced based on tris-(acetylacetonato) ruthenium(III) ($Ru(acac)_3$) and related compounds that have a small highest occupied molecular orbital (HOMO) energy. In this case, holes from the cathode are transported along the HOMO of $Ru(acac)_3$ and recombine with electrons at the acceptor/EBL interface, as shown in FIG. 1b.

The inventors have discovered a third type of EBL where the lowest occupied molecular orbital (LUMO) is aligned with that of the acceptor, allowing for low-resistance transport of electrons directly from acceptor to cathode. It is shown that 3,4,9,10 perylenetetracarboxylic bisbenzimidazole (PTCBI) serves as an efficient electron conductor and forms a low energy barrier contact with the Ag cathode. This leads to an increased fill factor from FF=0.60 typical of analogous BCP-based devices, to FF=0.70. Additionally, 1,4,5,8-napthalene-tetracarboxylic-dianhydride (NTCDA) is shown to function as a wide-gap electron-conducting EBL. By using both NTCDA and PTCBI in a compound blocking layer structure as in FIG. 1c, an optimal optical spacing is obtained, leading to increased photocurrent. This results in a spectrally corrected power conversion efficiency of $\eta_p$=5.1±0.1% under 1 sun, AM1.5G simulated solar illumination, an improvement of >25% compared to a conventional device with a BCP blocker.

Figure 1:
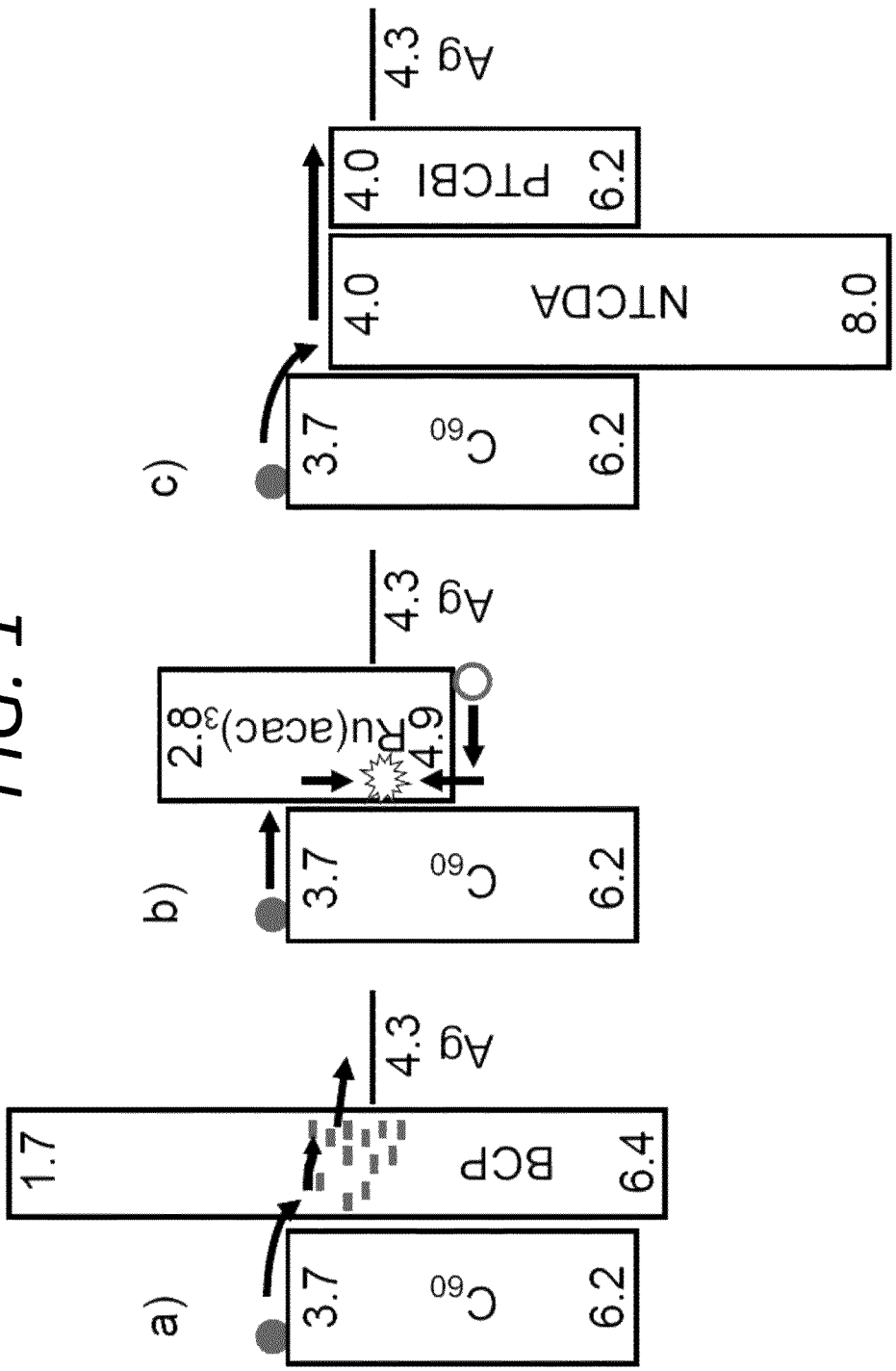
FIG. 1 Shows energy level diagrams of exciton blocking layers that transport charge via a) damage-induced trap states, b) electron-hole recombination, and c) electron transport through the lowest unoccupied molecular orbital.

The HOMO and LUMO energies of $C_{60}$ are 6.2 and 3.7 eV, respectively, while BCP has corresponding energies of 6.4 and 1.7 eV, as shown in FIG. 1. Although the low LUMO energy of BCP suggests a large barrier to electron extraction at the cathode, transport in BCP occurs through damage-induced trap states created by the evaporation of hot metal atoms onto the BCP surface. Because the PTCBI and NTCDA LUMOs approximately align with that of $C_{60}$, electron transport can occur between these materials in the absence of damage.

In at least one embodiment, the PV cell is a planar heterojunction cell. In another embodiment, is PV cell is a planar-mixed heterojunction cell. In other embodiments of the present disclosure, the PV cell is non-planar. For example, the photo-active region may form at least one of a mixed heterojunction, planar heterojunction, bulk heterojunction, nanocrystalline-bulk heterojunction, and hybrid planar-mixed heterojunction.

Regardless of the type of cell, the organic photosensitive optoelectronic device disclosed herein comprises at least one photoactive region in which light is absorbed to form an excited state, i.e., "excitons," which may subsequently dissociate in to an electron and a hole. Because the dissociation of the exciton will typically occur at the heterojunction formed by the juxtaposition of an acceptor layer and a donor layer comprising the photoactive region, an exciton barrier layer is typically desired to prevent excitons generated in the acceptor from quenching at the cathode.

The device presently disclosed comprises two electrodes comprising an anode and a cathode. Electrodes or contacts are usually metals or "metal substitutes." Herein the term metal is used to embrace both materials composed of an elementally pure metal, e.g., Al, and also metal alloys which are materials composed of two or more elementally pure metals. Here, the term "metal substitute" refers to a material that is not a metal within the normal definition, but which has the metal-like properties that are desired in certain appropriate applications.

Commonly used metal substitutes for electrodes and charge transfer layers include doped wide bandgap semiconductors, for example, transparent conducting oxides such as indium tin oxide (ITO), gallium indium tin oxide (GITO), and zinc indium tin oxide (ZITO). In particular, ITO is a highly doped degenerate n+ semiconductor with an optical bandgap of approximately 3.2 eV rendering it transparent to wavelengths greater than approximately 3900 Å.

Another suitable metal substitute material is the transparent conductive polymer polyanaline (PANI) and its chemical relatives. Metal substitutes may be further selected from a wide range of non-metallic materials, wherein the term "non-metallic" is meant to embrace a wide range of materials provided that the material is free of metal in its chemically uncombined form. When a metal is present in its chemically uncombined form, either alone or in combination with one or more other metals as an alloy, the metal may alternatively be referred to as being present in its metallic form or as being a "free metal." Thus, the metal substitute electrodes of the present disclosure may sometimes be referred to as "metal-free" wherein the term "metal-free" is expressly meant to embrace a material free of metal in its chemically uncombined form. Free metals typically have a form of metallic bonding that may be thought of as a type of chemical bonding that results from a sea of valence electrons throughout the metal lattice. While metal substitutes may contain metal constituents they are "non-metallic" on several bases. They are not pure free-metals nor are they alloys of free-metals. When metals are present in their metallic form, the electronic conduction band tends to provide, among other metallic properties, a high electrical conductivity as well as a high reflectivity for optical radiation.

Herein, the term "cathode" is used in the following manner. In a non-stacked PV device or a single unit of a stacked PV device under ambient irradiation and connected with a resistive load and with no externally applied voltage, e.g., a solar cell, electrons move to the cathode from the adjacent photoconducting material. Similarly, the term "anode" is used herein such that in a solar cell under illumination, holes move to the anode from the adjacent photoconducting material, which is equivalent to electrons moving in the opposite manner. It will be noted that the terms are used herein anodes and cathodes may be electrodes or charge transfer regions.

When a PV cell is operating under illumination, the output photocurrent is formed by collecting photo-generated electrons at cathode and photo-generated-holes at anode. The dark current flows in the opposite direction due to induced potential drop and electric field. Electrons and holes are injected from cathode and anode, respectively, and can go to the opposite electrodes if they do not encounter significant energy barriers. They can also recombine at the interface to form recombination current. Thermally generated electrons and holes inside the active region can also contribute to the dark current. Although this last component is dominating when the solar cell is reverse biased, it is negligible under forward bias condition.

The dark current of an operating PV cell mainly come from the following sources: (1) the generation/recombination current $I_{gr}$, due to the electron-hole recombination at donoracceptor interface, (2) the electron leakage current $I_e$ due to the electrons going from the cathode to the anode through the donor/acceptor interface, and (3) the hole leakage current $I_h$ due to the holes going from the anode to the cathode through the donor/acceptor interface. In operation a solar cell has no externally applied bias. The magnitudes of these current components are dependent on the energy levels. $I_{gr}$ increases with the decrease of interfacial gap $\Delta E_g$. $I_e$ increases with the decrease of $\Delta E_L$, which is the difference of the lowest unoccupied molecular orbital (LUMO) energies of the donor and acceptor. $I_h$ increases with the decrease of $\Delta E_H$, which is the difference of the highest occupied molecular orbital (HOMO) energies of the donor and acceptor. Any of these three current components can be the dominating dark current depending on the energy levels of the donor and acceptor materials.

In one embodiment, the photo-active region forms at least one of a mixed heterojunction, bulk heterojunction, nanocrystalline-bulk heterojunction, and hybrid planar-mixed heterojunction.

Stacked organic photosensitive optoelectronic devices are further contemplated herein. The stacked device according to the present disclosure may comprise a plurality of photosensitive optoelectronic subcells, wherein at least one subcell comprises two electrodes comprising an anode and a cathode in superposed relation; a donor region between the two electrodes, the donor region formed of a first photoconductive organic semiconductor material; an acceptor region between the two electrodes and adjacent to the donor region, the acceptor region formed of a second photoconductive organic semiconductor material; and at least one of an electron blocking layer and a hold blocking layer between the two electrodes, and adjacent to at least one of the donor region and the acceptor region. Such stack devices may be constructed in accord with the present disclosure to achieve high internal and external quantum efficiencies.

When the term "subcell" is used hereafter, it refers to an organic photosensitive optoelectronic construction which may include at least one of an electron blocking EBL and a hole blocking EBL in accordance with the present disclosure. When a subcell is used individually as a photosensitive optoelectronic device, it typically includes a complete set of electrodes, i.e., positive and negative. As disclosed herein, in some stacked configurations it is possible for adjacent subcells to utilize common, i.e., shared, electrode, charge transfer region or charge recombination zone. In other cases, adjacent subcells do not share common electrodes or charge transfer regions. The term "subcell" is disclosed herein to encompass the subunit construction regardless of whether each subunit has its own distinct electrodes or shares electrodes or charge transfer regions with adjacent subunits. Herein the terms "cell", "subcell", "unit", "subunit", "section", and "subsection" are used interchangeably to refer a photoconductive region or set of regions and the adjoining electrodes or charge transfer regions. As used herein, the terms "stack", "stacked", "multisection" and "multicell" refer to any optoelectronic device with multiple regions of a photoconductive material separated by one or more electrode or charge transfer regions.

Since the stacked subcells of the solar cell may be fabricated using vacuum deposition techniques that allow external electrical connections to be made to the electrodes separating the subcells, each of the subcells in the device may be electrically connected either in parallel or in series, depending on whether the power and/or voltage generated by the PV cell is to be maximized. The improved external quantum efficiency that may be achieved for stacked PV cell embodiments of the present disclosure may also be attributed to the fact that the subcells of the stacked PV cell may be electrically connected in parallel since a parallel electrical configuration permits substantially higher fill factors to be realized than when the subcells are connected in series.

In the case when the PV cell is comprised of subcells electrically connected in series so as to produce a higher voltage device, the stacked PV cell may be fabricated so as to have each subcell producing approximately the same current so to reduce inefficiency. For example, if the incident radiation passes through in only one direction, the stacked subcells may have an increasing thickness with the outermost subcell, which is most directly exposed to the incident radiation, being the thinnest. Alternatively, if the subcells are superposed on a reflective surface, the thicknesses of the individual subcells may be adjusted to account for the total combined radiation admitted to each subcell from the original and reflected directions.

Further, it may be desirable to have a direct current power supply capable of producing a number of different voltages. For this application, external connections to intervening electrodes could have great utility. Accordingly, in addition to being capable of providing the maximum voltage that is generated across the entire set of subcells, an exemplary embodiment the stacked PV cells of the present disclosure may also be used to provide multiple voltages from a single power source by tapping a selected voltage from a selected subset of subcells.

Representative embodiments of the present disclosure may also comprise transparent charge transfer regions. As described herein charge transfer layers are distinguished from acceptor and donor regions/materials by the fact that charge transfer regions are frequently, but not necessarily, inorganic and they are generally chosen not to be photoconductively active.

The organic photosensitive optoelectronic device disclosed herein may be useful in a number of photovoltaic applications. In at least one embodiment, the device is an organic photodetector. In at least one embodiment, the device is an organic solar cell.

EXAMPLES

The present disclosure may be understood more readily by reference to the following detailed description of exemplary embodiments and the working examples. It is understood that other embodiments will become apparent to those skilled in the art in view of the description and examples disclosed in this specification.

Example 1

Devices were grown on 150 nm thick layers of indium tin oxide (ITO) pre-coated onto glass substrates. Prior to deposition, the ITO surface was cleaned in a surfactant and a series of solvents and then exposed to ultraviolet-ozone for 10 min before loading into a high vacuum chamber (base pressure <$10^{-7}$ Torr) where $MoO_3$ was thermally evaporated at ~0.1 nm/s. Substrates were then transferred to a $N_2$ glovebox where 2,4-bis[4-(N-Phenyl-1-naphthylamino)-2,6-dihydroxyphenyl]squaraine (1-NPSQ, see molecular structural formula in FIG. 2, inset) films were spin-coated from heated 6.5 mg/ml solutions in 1,2-dichlorobenzene, and thermally annealed on a hot plate at 110° C. for 5 min to promote the growth of a nanocrystalline morphology.

Substrates were once again transferred into the high vacuum chamber for deposition of purified organics at 0.1 nm/s, followed by a 100 nm thick Ag cathode deposited at 0.1 nm/s through a shadow mask with an array of 1 mm diameter openings. Current density versus voltage (J-V) characteristics were measured in an ultra-pure $N_2$ ambient, in the dark and under simulated AM1.5G solar illumination from a filtered 150 W Xe lamp. Lamp intensity was varied using neutral density filters. Optical intensities were referenced using an NREL-calibrated Si detector, and photocurrent measurements were corrected for spectral mismatch. Errors quoted correspond to the deviation from the average value of three or more devices on the same substrate.

Figure 5:
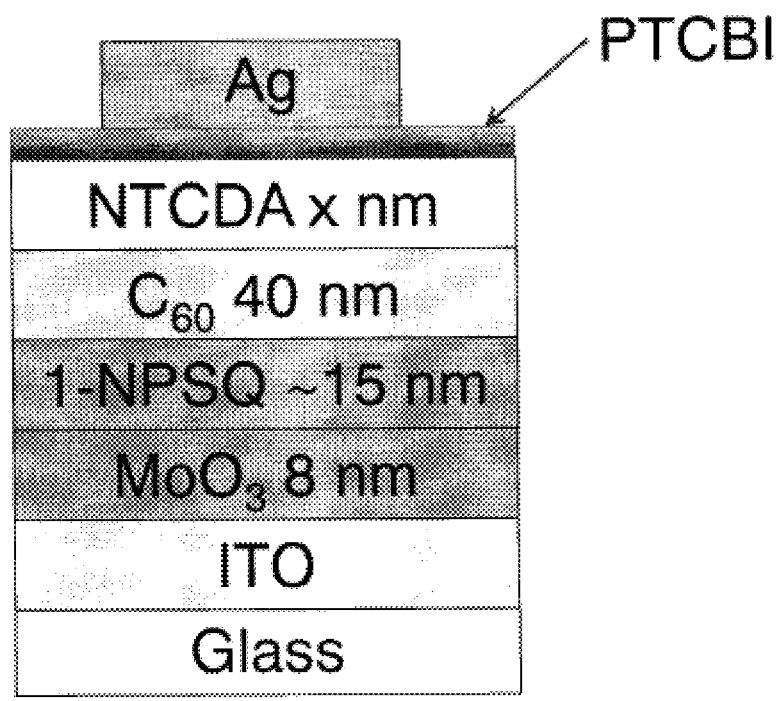
FIG. 5 shows an example of a device schematic having two electrodes in superposed relation, a photoactive region between the two electrodes, and a blocking region comprising at least one wide-gap electron conducting exciton blocking material (NTCDA) and at least one electron conducting material (PTCBI).

Devices were fabricated with the following structure: glass/150 nm ITO/8 nm $MoO_3$/15 nm 1-NPSQ/40 nm $C_{60}$/buffer(s)/100 nm Ag. The open-circuit voltage depended on the interfacial energy gap between the donor and acceptor, and was found to be $V_{oc}$=0.90 to 0.96±0.01 V, independent of buffer layer composition. FIG. 5 shows a schematic of the device structure having an ITO anode, a photo-active region formed of 1-NPSQ and $C_{60}$, and a blocking region formed of NTCDA and PTCBI between the $C_{60}$ acceptor and the Ag cathode.

Figure 2:
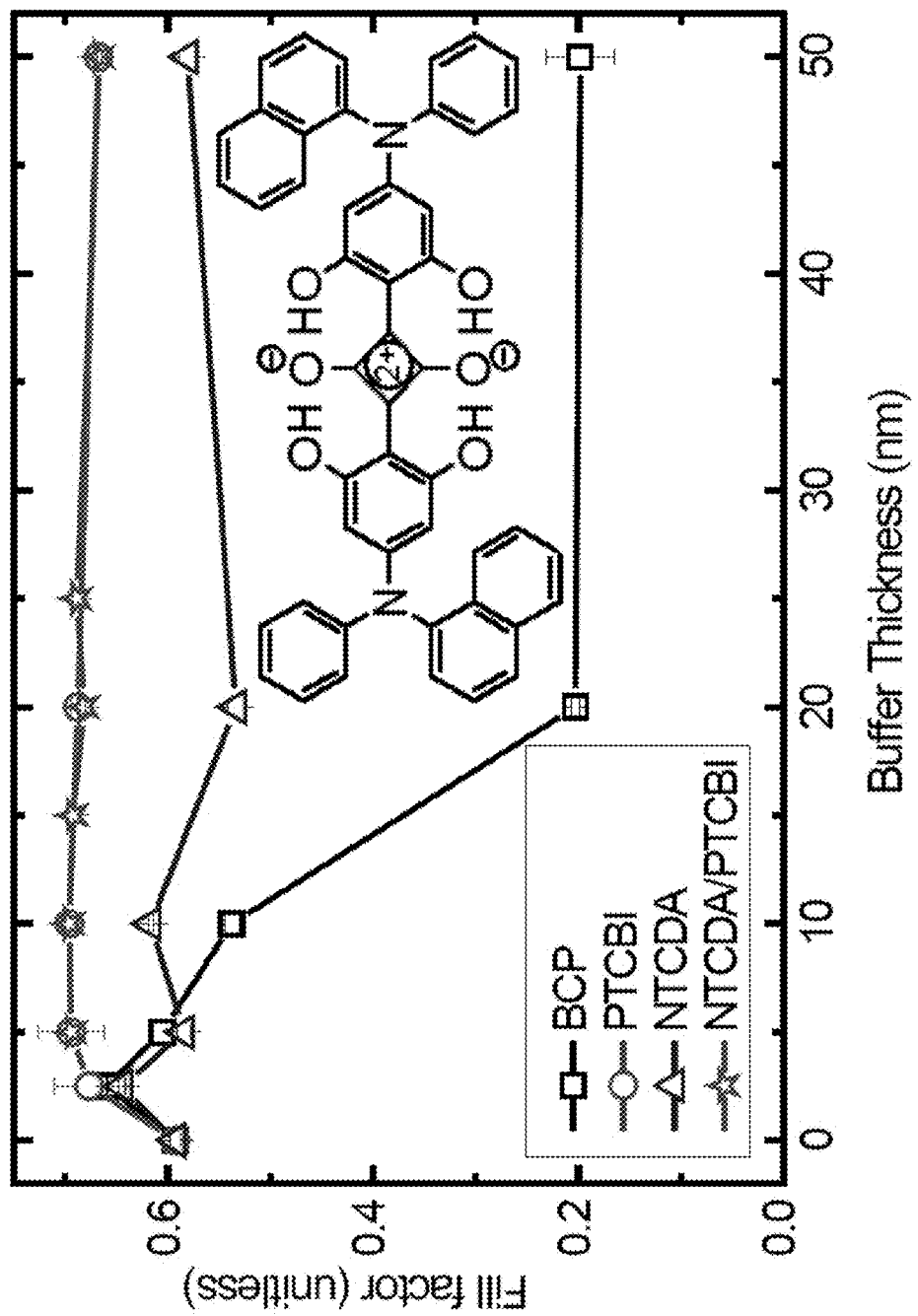
FIG. 2 shows fill factor (FF) under spectrally corrected 1 sun, AM1.5G illumination for devices with BCP buffer layers (squares), PTCBI (circles), NTCDA (triangles), and compound NTCDA/PTCBI (stars) as functions of thickness. Lines are a guide to the eye. Inset: the molecular structure of 1-NPSQ.

FIG. 2 shows FF as a function of buffer layer thickness x for BCP, PTCBI, NTCDA, and compound buffers consisting of (x-5) nm NTCDA/5 nm PTCBI. Optimal performance for devices with BCP occurs at a thickness of 5 nm, with FF=0.60±0.01, beyond which there was sharp drop in efficiency due to the limited depth of damage-induced transport states extending into the film from the surface. In contrast, devices with PTCBI exhibit FF=0.70±0.01, with only a small reduction as x→50 nm, confirming the low resistance transport in this material. The optimum thickness for PTCBI was 10 nm, where $\eta_p$ decreased for thicker films due to a decrease in short-circuit photocurrent ($J_{sc}$), since PTCBI absorption overlaped with that of the active acceptor and donor layers. Devices with NTCDA buffer layers showed FF=0.62±0.01. In contrast, devices with a compound 15 nm NTCDA/5 nm PTCBI buffer had a FF=0.68±0.01, which was similar to that of PTCBI alone.

Figure 3:
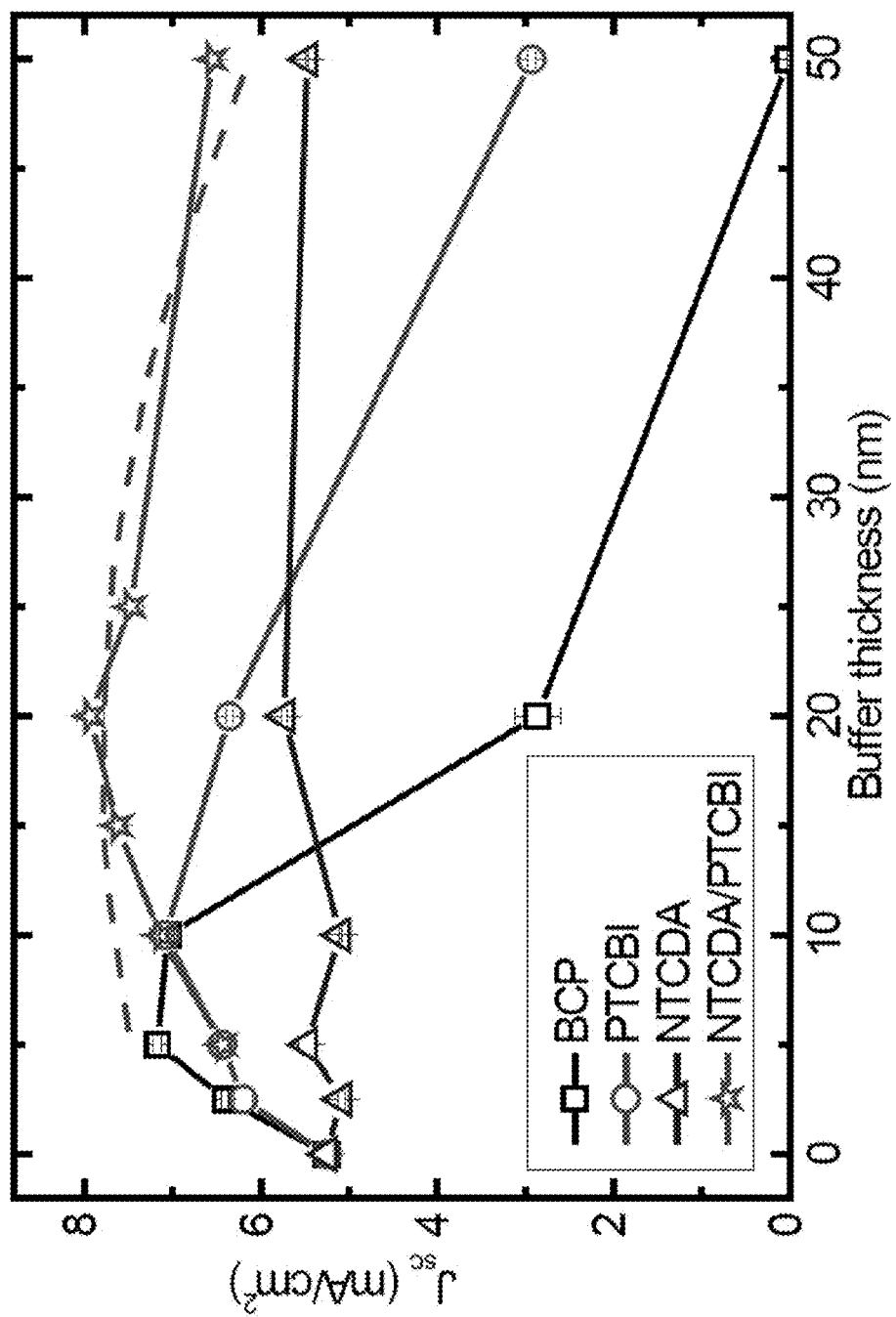
FIG. 3 shows spectrally corrected short-circuit current ($J_{sc}$) under 1 sun, AM1.5G illumination for devices with BCP buffer layers (squares), PTCBI (circles), NTCDA (triangles), and compound NTCDA/PTCBI (stars) as a function of thickness. Solid lines are a guide to the eye. The dashed line is $J_{sc}$ modeled based on the optical intensity in the device for the case of the NTCDA/PTCBI buffer.

The compound NTCDA/PTCBI buffer layer lead to increases in $J_{sc}$ compared to PTCBI alone. Unlike PTCBI, the wide energy gap NTCDA was transparent across the visible spectrum. Hence, the PTCBI was kept sufficiently thin (5 nm) to provide a low-barrier cathode contact without introducing excessive optical absorption. At the same time, the NTCDA thickness was adjusted to maximize the optical field at the donor-acceptor junction without increasing series resistance, contrary to the case with BCP. The trend in $J_{sc}$ as a function buffer layer agreed with optical modeling using the transfer-matrix approach, shown by the dashed line in FIG. 3. Optimized devices employing compound buffers achieve $J_{sc}$=8.0±0.1 mA/cm$^2$ compared to 7.2±0.1 mA/cm$^2$ for BCP and 7.1±0.1 mA/cm$^2$ for PTCBI, as seen in FIG. 3. For devices without a buffer and with BCP, PTCBI, NTCDA, and PTCBINTCDA buffers, the following values were measured $\eta_p$=2.8±0.1, 4.0±0.1, 4.6±0.1, 3.2±0.1, and 5.1±0.1%, respectively. These results are summarized in Table 1.

Figure 4:
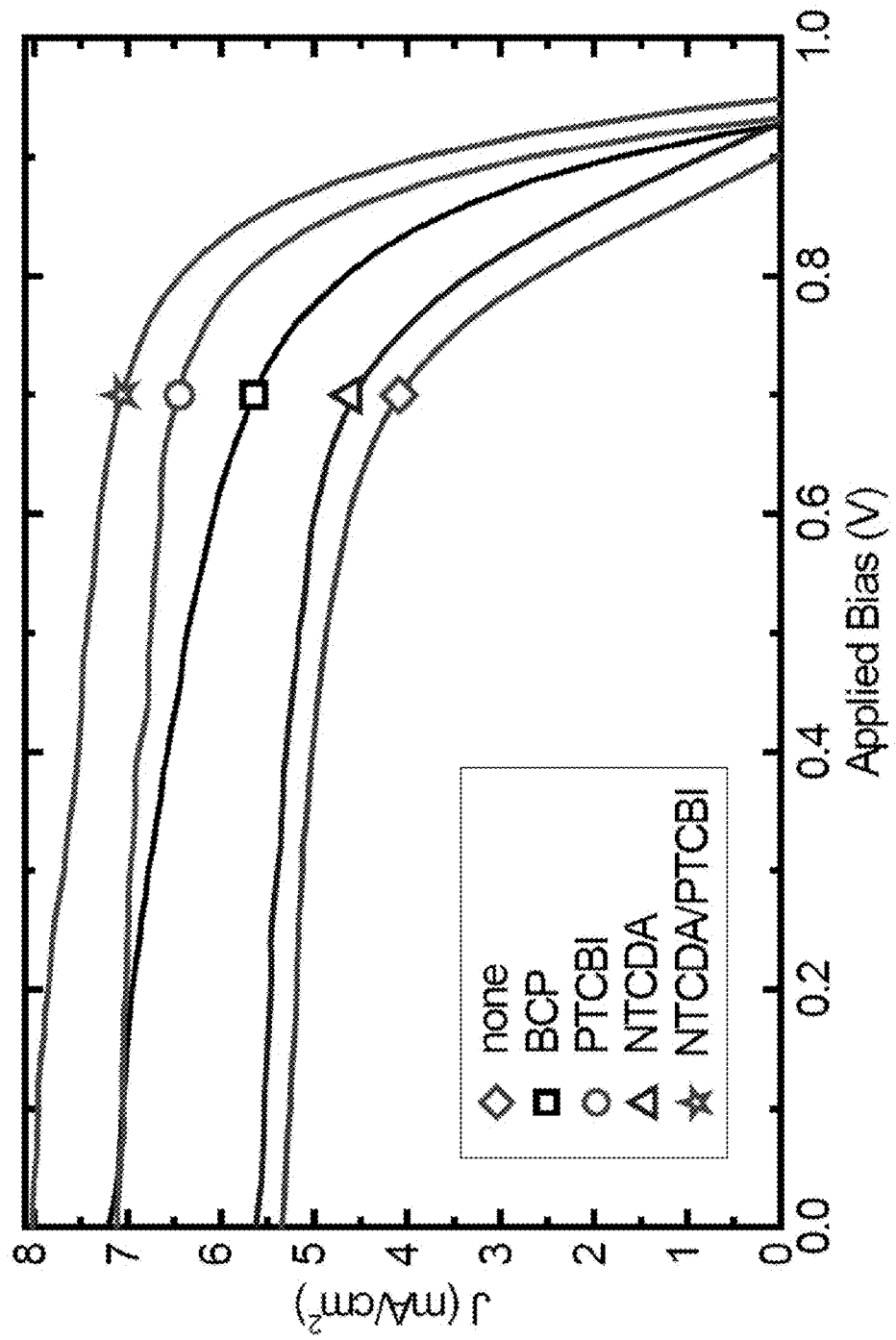
FIG. 4 shows spectrally corrected current density vs. voltage characteristics in the $4^{th}$ quadrant under 1 sun, AM1.5G illumination for optimized devices with no buffer (diamond), 5 nm BCP (square), 10 nm PTCBI (circle), 10 nm NTCDA (triangle), and compound 15 nm NTCDA/5 nm PTCBI buffers (star).

To understand the differences in FF between the several buffer layer combinations explored, we describe the current density using the ideal diode equation:

$$J=J_s\{\exp[q(V_a-JR_s)/nk_bT]-1\}-q\eta_{PPd}(V_a)J_X, \quad (1)$$

where $J_s$ is the reverse saturation current, n is the ideality factor, $V_a$ is the applied voltage, $R_s$ is the series resistance, T is temperature, q is the electron charge, $\eta_{PPd}(V_a)$ is the field-dependent polaron pair dissociation efficiency, and $J_X$ is the exciton current reaching the heterojunction. For optimized BCP, PTCBI, and NTCDA/PTCBI buffer layer devices, $R_s$<10 Ω-cm$^2$, indicating efficient transport of electrons to the cathode. With layers as thick as 50 nm, $R_s$ for PTCBI and compound buffers does not change appreciably, while for BCP it increases to >10 kΩ-cm$^2$ for x=50 nm. Devices with NTCDA-only buffers have $R_s$>100 Ω-cm$^2$ for all thicknesses, due to an electron extraction barrier formed at the NTCDA/Ag interface, which has been reported to be >1 eV. However, NTCDA-based devices that include a 5 nm thick layer of PTCBI have a similar $R_s$ to that of PTCBI alone, in good agreement with the previous reports of a ≤0.1 eV barrier at the PTCBI/Ag interface. One possible mechanism for the difference in FF for devices with BCP or PTCBI is the effect of trapped charges on the internal electric field. From Eq. 1, the current density for a device under illumination is determined by the field-dependence of $\eta_{PPd}$. Because electron transport in BCP occurs through damage-induced traps, their residence in these deep levels induces an electric field that is opposite to the field induced by $V_a$, resulting in increased recombination at the heterojunction. This appears in the J-V characteristic as an increased slope at zero bias (see FIG. 4), leading to a decrease in FF.

The performances of all devices are summarized in Table 1. The values for $V_{OC}, J_{SC}$, fill factor (FF), and power conversion efficiency ($\eta_p$) were measured at one sun standard AM1.5G solar illumination.

TABLE 1

Performance for devices with different buffer layers under simulated 1 sun (mismatch corrected), AM1.5G illumination.

| Buffer Layer | Thickness (nm) | $V_{oc}$ (V) | FF | $J_{sc}$ (mA/cm$^2$) | $\eta_p$ (%) |
|---|---|---|---|---|---|
| none | 0 | 0.90 | 0.59 | 5.3 | 2.8 ± 0.1 |
| BCP | 5 | 0.93 | 0.60 | 7.2 | 4.0 ± 0.1 |
| PTCBI | 10 | 0.94 | 0.70 | 7.1 | 4.6 ± 0.1 |
| NTCDA | 10 | 0.94 | 0.62 | 5.6 | 3.2 ± 0.1 |
| NTCDA/PTCBI | 15/5 | 0.95 | 0.68 | 8.0 | 5.1 ± 0.1 |

As shown, the Inventors have demonstrated the use of electron conducting EBLs in OPVs. Here, electrons are transported via the LUMO states directly from that of the acceptor to the cathode. By using PTCBI as a buffer layer, a FF=0.70±0.01, compared to FF=0.60±0.01 for conventional BCP-based devices. Adding an NTCDA electron-conducting EBL in combination with PTCBI allows for optimized optical spacing and efficient exciton blocking, leading to an increase in $\eta_p$ that is >25% for an analogous squaraine/C$_{60}$/BCP OPV. The increased stability of PTCBI compared to BCP may also potentially extend the operational lifetime of OPVs employing blocking layers.

The specification and examples disclosed herein are intended to be considered as exemplary only, with a true scope and spirit of the invention being indicated in the following claims.

Other than in the examples, or where otherwise indicated, all numbers expressing quantities of ingredients, reaction conditions, analytical measurements, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present disclosure. At the very least, and not as an attempt to limit the application of the doctrine of equivalents to the scope of the claims, each numerical parameter should be construed in light of the number of significant digits and ordinary rounding approaches.

Notwithstanding that the numerical ranges and parameters setting forth the broad scope of the disclosure are approximations, unless otherwise indicated the numerical values set forth in the specific examples are reported as precisely as possible. Any numerical value, however, inherently contains certain errors necessarily resulting from the standard deviation found in their respective testing measurements.

What is claimed is:

1. An organic photosensitive optoelectronic device comprising: two electrodes comprising an anode and a cathode in superposed relation;
a photo-active region between the two electrodes; and a blocking region located between the photo-active region and the cathode that conducts electrons and blocks excitons, wherein said blocking region comprises at least one wide-gap electron conducting exciton blocking material and at least one electron conducting material.

2. The device of claim 1, wherein the photo-active region comprises at least one donor material and at least one acceptor material.

3. The device of claim 2, wherein the at least one acceptor has a lowest unoccupied molecular orbital energy (LUMO-1) and the at least one electron conducting exciton blocking material has a lowest unoccupied molecular orbital energy (LUMO-2), wherein LUMO-1 and LUMO-2 are aligned to permit electron transport directly from the acceptor material to the cathode.

4. The device of claim 3, wherein the energy gap between the first lowest unoccupied molecular orbital energy and the second lowest unoccupied molecular orbital energy is no greater than 0.3 eV.

5. The device of claim 2, wherein the at least one donor material comprises squarine (SQ), boron subphthalocyanonine chloride (SubPc), copper phthalocyanine (CuPc), chloro-aluminum phthalocyanine (ClAlPc), poly(3-hexylthiophene) (P3HT), tin phthalocyanine (SnPc), pentacene, tetracene, diindenoperylene (DIP), and combinations thereof.

6. The device of claim 2, wherein the at least one acceptor material is C$_{60}$, C$_{70}$ fullerenes, 3,4,9,10-perylenetetracarboxylic dianhydride (PTCDA), perfluorinated copper phthalocyanine (F$_{16}$—CuPc), PCBM, PC$_{70}$BM, and combinations thereof.

7. The device of claim 1, wherein the at least one electron conducting material comprises 3,4,9,10 perylenetetracarboxylic bisbenzimidazole (PTCBI).

8. The device of claim 1, wherein the at least one wide-gap electron conducting exciton blocking material comprises 1,4,5,8-napthalene-tetracarboxylic-dianhydride (NTCDA).

9. The device of claim 1, wherein the blocking region has a thickness ranging from 10-100 nm.

10. The device of claim 1, wherein the at least one electron conducting material has a thickness ranging from 2-10 nm.

11. The device of claim 1, wherein the at least one wide-gap electron conducting exciton blocking material has a thickness ranging from 5-100 nm.

12. The device of claim 1, wherein the at least one electron conducting material comprises 3,4,9,10 perylenetetracarboxylic bisbenzimidazole (PTCBI), and the at least one wide-gap electron conducting exciton blocking material comprises 1,4,5,8-napthalene-tetracarboxylic-dianhydride (NTCDA).

13. The device of claim 12, wherein the at least one wide-gap electron conducting exciton blocking material has a thickness ranging from 5-100 nm and the at least one electron conducting material has a thickness of up to 5 nm.

14. The device of claim 1, wherein the device is an organic photodetector.

15. The device of claim 14, wherein the organic photodetector is an organic solar cell exhibiting at least one of the following properties: a fill factor greater than 0.62, a spectrally corrected power conversion efficiency of at least 5.0% under 1 sun, AM1.5G illumination, or a short circuit current of at least 7.5 mA/cm$^2$.

16. The device of claim 1, wherein at least one electrode comprises transparent conducting oxides, thin metal layers, or transparent conducting polymers.

17. The device of claim 16, wherein the conducting oxides are chosen from indium tin oxide (ITO), tin oxide (TO), gallium indium tin oxide (GITO), zinc oxide (ZO), and zinc indium tin oxide (ZITO), thin metal layers are comprised of Ag, Al, Au or combinations thereof, and the transparent conductive polymers comprise polyanaline (PANI) and 3,4-polyethylenedioxythiophene:polystyrenesulfonate (PEDOT:PSS).

18. The device of claim 1, wherein at least one electrode comprises a metal substitute, a non-metallic material or a metallic material chosen from Ag, Au, Ti, Sn, and Al.

19. A method of making an organic photosensitive optoelectronic device, said method comprising depositing onto a substrate: two electrodes comprising an anode and a cathode in superposed relation; a photo-active region between the two electrodes; and a blocking region located between the photo-active region and the cathode that conducts electrons and blocks excitons, wherein said blocking region comprises at least one wide-gap electron conducting exciton blocking material and at least one electron conducting material.

20. The method of claim 19, wherein the photo-active region comprises at least one donor material and at least one acceptor material.

21. The method of claim 20, wherein the at least one donor material is chosen from squarine (SQ), boron subphthalocyanonine chloride (SubPc), copper phthalocyanine (CuPc), chloro-aluminum phthalocyanine (ClAlPc), poly(3-hexylthiophene) (P3HT), tin phthalocyanine (SnPc), pentacene, tetracene, diindenoperylene (DIP), and combinations thereof.

22. The method of claim 20, wherein the at least one acceptor material is chosen from $C_{60}$, $C_{70}$ fullerenes, 3,4,9,10-perylenetetracarboxylic dianhydride (PTCDA), perfluorinated copper phthalocyanine ($F_{16}$—CuPc), PCBM, $PC_{70}BM$, and combinations thereof.

23. The method of claim 19, wherein said at least one acceptor has a lowest unoccupied molecular orbital energy (LUMO-1) and the at least one electron conducting exciton blocking material has a lowest unoccupied molecular orbital energy (LUMO-2), wherein LUMO-1 and LUMO-2 are aligned to permit electron transport directly from the photo-active region to the cathode.

24. The method of claim 23, wherein the energy gap between the first lowest unoccupied molecular orbital energy and the second lowest unoccupied molecular orbital energy is no greater than 0.3 eV.

25. The method of claim 19, wherein the at least one wide-gap electron conducting exciton blocking material comprises 1,4,5,8-napthalene-tetracarboxylic-dianhydride (NTCDA).

26. The method of claim 19, wherein the blocking region has a thickness ranging from 10-100 nm.

27. The method of claim 19, wherein the at least one electron conducting material has a thickness ranging from 2-10 nm.

28. The method of claim 19, wherein the at least one wide-gap electron conducting exciton blocking material has a thickness ranging from 5-100 nm.

29. The method of claim 19, wherein the at least one electron conducting material comprises 3,4,9,10 perylenetetracarboxylic bisbenzimidazole (PTCBI), and the at least one wide-gap electron conducting exciton blocking material comprises 1,4,5,8-napthalene-tetracarboxylic-dianhydride (NTCDA).

30. The method of claim 29, wherein the at least one wide-gap electron conducting exciton blocking material has a thickness ranging from 5-100 nm and the at least one electron conducting material has a thickness of up to 5 nm.

31. The method of claim 19, wherein at least one electrode comprises transparent conducting oxides, thin metal layers, or transparent conducting polymers.

32. The method of claim 31, wherein the conducting oxides are chosen from indium tin oxide (ITO), tin oxide (TO), gallium indium tin oxide (GITO), zinc oxide (ZO), and zinc indium tin oxide (ZITO), thin metal layers are comprised of Ag, Al, Au or combinations thereof, and the transparent conductive polymers comprise polyanaline (PANI), and 3,4-polyethylenedioxythiophene:polystyrenesulfonate (PEDOT:PSS).

33. The method of claim 19, wherein at least one electrode comprises a metal substitute, a non-metallic material or a metallic material chosen from Ag, Au, Ti, Sn, and Al.

* * * * *